United States Patent

Kool et al.

Patent Number: 5,953,644
Date of Patent: Sep. 14, 1999

[54] MICROWAVE TRANSMISSION SYSTEM

[75] Inventors: Leo Kool, Apeldoorn, Netherlands; Ian Mc.Colloch Clarke, Disley, United Kingdom

[73] Assignee: U.S. Philips Corporation, New York, N.Y.

[21] Appl. No.: 08/901,339

[22] Filed: Jul. 28, 1997

Related U.S. Application Data

[63] Continuation of application No. 08/435,055, May 8, 1995.

[30] Foreign Application Priority Data

May 6, 1994 [EP] European Pat. Off. .............. 94201250

[51] Int. Cl.$^6$ ........................................... H04B 1/26
[52] U.S. Cl. ........................ 455/328; 455/330; 343/786
[58] Field of Search .................................. 455/302, 307, 455/317, 325, 326, 327, 328; 343/781 LA, 786

[56] References Cited

U.S. PATENT DOCUMENTS

| | | | |
|---|---|---|---|
| H1034 | 3/1992 | Lohrmann | 343/781 LA |
| 3,696,432 | 10/1972 | Anderson et al. | 343/756 |
| 4,411,022 | 10/1983 | Clifton et al. | 455/327 |
| 4,418,429 | 11/1983 | Roberts | 455/328 |
| 4,439,768 | 3/1984 | Ebneth et al. | 343/18 B |
| 4,460,897 | 7/1984 | Gans | 343/754 |
| 4,608,713 | 8/1986 | Shiomi et al. | 455/325 |
| 4,654,888 | 3/1987 | Ohta et al. | 455/328 |
| 4,897,663 | 1/1990 | Kusano et al. | 343/786 |
| 4,996,535 | 2/1991 | Profera, Jr. | 343/786 |
| 5,125,110 | 6/1992 | Nusair | 455/327 |
| 5,224,218 | 6/1993 | Shiga | 455/327 |
| 5,305,007 | 4/1994 | Orr et al. | 455/228 |
| 5,396,658 | 3/1995 | Hwu et al. | 455/327 |
| 5,640,700 | 6/1997 | Shingyoji et al. | 455/328 |

FOREIGN PATENT DOCUMENTS

| | | | |
|---|---|---|---|
| 0021426 | 7/1981 | European Pat. Off. | H03D 9/06 |
| 0003404 | 1/1983 | Japan | 455/327 |
| 2100539 | 12/1982 | United Kingdom | 455/327 |

OTHER PUBLICATIONS

"Microwave Engineering" by A.F. Harvey, 1963 Academic Press London & New York, pp. 11–19.

"Microwave Devices, Device Circuit Interactions", by M.J. Howes et al, John Wiley & Sons, pp. 344–345.

Primary Examiner—Reinhard J. Eisenzopf
Assistant Examiner—Sam Bhattacharya
Attorney, Agent, or Firm—Jack D. Slobod

[57] ABSTRACT

In a microwave transmission system a microwave signal is transmitted by a transmitter (1) using an antenna (2) to a receiver (4) which employs an antenna (3). The received signal is coupled to a mixer (17) via a waveguide section (15) having a cut off frequency being higher than the frequency of the signal generated by the local oscillator unit (18). In this way undesired emission of local oscillator signal is avoided. Furthermore no additional image rejection filter is required.

4 Claims, 3 Drawing Sheets

MICROWAVE TRANSMISSION SYSTEM

This is a continuation division of application Ser. No. 08/435,055, filed May 8, 1995.

BACKGROUND OF THE INVENTION

1. Field of Invention

The invention is related to a microwave transmission system comprising a microwave transmitter coupled to at least one microwave receiver via a transmission link, an input of the microwave receiver being coupled to a first input of a mixer via a transmission line, a local oscillator being coupled to a second input of the mixer. The invention is also related to a receiver and a frequency conversion unit for use in such a transmission system.

2. Description of the Related Art

A transmission system of the aforementioned type is known from the book "Microwave devices" by M. J. Howes and D. V. Morgan, published by Wiley Interscience, ISBN 0 471 41729 7. pp. 344–345.

Recently two new frequency bands in the microwave range have been allocated for broadcast purposes. These are the bands from 40.5 GHz–42.5 GHz in CEPT (Conference of European Post and Telecommunication Administrations) countries and from 27.5 GHz–29.5 GHz in other countries. There are several plans to use these frequency bands for distributing TV programs direct to the homes of the subscribers. Also other microwave frequencies can be used if they are made available for broadcast purposes by the regulatory authorities.

In the prior art system a microwave signal is transmitted by a transmitter, which microwave signal is received by a microwave receiver. The microwave receiver comprises a mixer having one input coupled to an antenna, and having one input coupled to a local oscillator. The output of the mixer carrying an IF signal having a frequency of 750 MHz is coupled via a filter to a demodulator, for demodulating the received signal. With widespread use of such transmission systems, care has to be taken to prevent the generation of interference by such systems. One possible source of interference is the radiation of the local oscillator signal. This local oscillator signal leaks via the mixer to the antenna where it is transmitted into free space. In the prior art system a complex bandpass filter would be required to prevent this undesired radiation.

OBJECT AND SUMMARY OF THE INVENTION

The object of the present invention is to provide a microwave transmission system in which the undesired radiation of the local oscillator is prevented in an easy and inexpensive way.

Therefore the invention is characterised in that the transmission line has a high pass transfer function with a predetermined cut off frequency and in that the frequency of the local oscillator is lower than the predetermined cut off frequency.

By using a transmission line having a high pass transfer function and a local oscillator frequency having a frequency below this cut off frequency, the local oscillator signal which leaks through the mixer is strongly attenuated by the transmission line before the local oscillator signal reaches the antenna.

In every receiver using down conversion of the signal to be received by mixing it with a local oscillator signal the frequency of the signal to be received can have the values $|f_{LO}+f_{if}|$ and $|f_{LO}-f_{if}|$, $f_{LO}$ being the local oscillator frequency and $f_{if}$ the intermediate frequency. If the frequency of the signal to be received is equal to $|f_{LO}+f_{if}|$ (as it is in the transmission system according to the invention ) the so called mirror frequency is equal to $|f_{LO}-f_{if}|$. It is customary in the art that a so called mirror suppression filter is present between the antenna and the mixer. An additional advantage of the present invention is that no separate mirror suppression filter has to be added, because the mirror frequency signal being lower in frequency than the local oscillator signal is effectively suppressed by the transmission line having a high pass transfer function.

An embodiment of the invention is characterised in that the output of the mixer is coupled to an input of a standard down converter having an input frequency in the range from 10–14 GHz.

The use of a standard down converter having an input frequency in the range from 10 to 14 GHz has the advantage that use can be made of down converters which are commonly used for domestic satellite reception. These down converters are manufactured in large quantities, and can consequently be relatively cheap. Furthermore these standard downconverters have an excellent noise figure, resulting in a good noise figure for the complete receiver.

A further embodiment of the invention is characterised in that the transmission line comprises a waveguide.

A waveguide is an inexpensive type of transmission line having a high pass transfer function. The cut off frequency can be set to the desired value by choosing suitable dimensions of the waveguide. The actual desired attenuation value of the local oscillator signal can be obtained by choosing a suitable length of the waveguide.

A further embodiment of the invention is characterised in that the receiver comprises a reflector for reflecting a received microwave to the input of the transmission line, and in that the receiver comprising modifying means to modify the effective area of the reflector.

By using a reflector of which the effective area can be modified it is possible to reduce the sensitivity of the receiver when a strong signal is received. This may be useful to prevent overload of the mixer which can cause intolerable distortion of the received signal.

BRIEF DESCRIPTION OF THE DRAWING

The invention will now be described, by way of example, with reference to the drawings wherein.

DETAILED DESCRIPTION OF THE PREFERRED EMBODIMENTS

Figure 1:
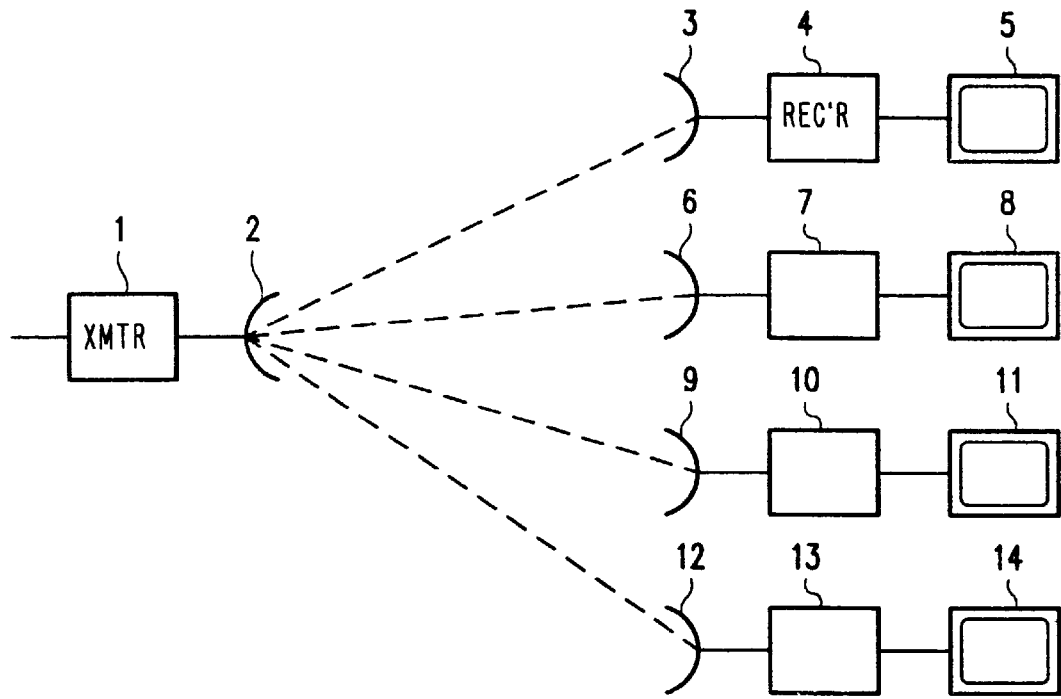
FIG. 1 shows a generalized schematic view of a transmission system according to the invention.

In the transmission system according to FIG. 1 a TV signal to be transmitted is applied to the input of a transmitter 1. The TV signal, which can have an analog format (e.g. PAL, NTSC or SECAM) or a digital format (e.g. MPEG) is modulated and upconverted to an RF signal in the desired frequency band. This frequency band can be the band from 40.5 GHz–42.5 GHz in CEPT countries and the band from 27.5 GHz–29.5 GHz in other countries. Also other microwave frequencies an be used if they are made available for broadcast purposes by the regulating authorities. The RF signal generated by the transmitter 1 is radiated by the antenna 2. The antenna 2 can be a horn antenna, or can be a small parabolic reflector with corresponding feed.

The signal transmitted by the antenna 2 is received by a number of receivers each present at a subscriber site to be provided with the TV signal. At each subscriber site the signal transmitted by the transmitter 1 is received by means of the corresponding antenna 3,6,9 or 12. The signal from the antenna 3,6,9,12 is processed by the corresponding receiver 4,7,10 or 12 to obtain a TV signal which is delivered to the corresponding TV set 5,8,11 or 14. It is observed that the use of a transmission system according to FIG. 1 is not limited to TV signals, but that it also can be used for other type of signals, e.g. data signals.

Figure 2:
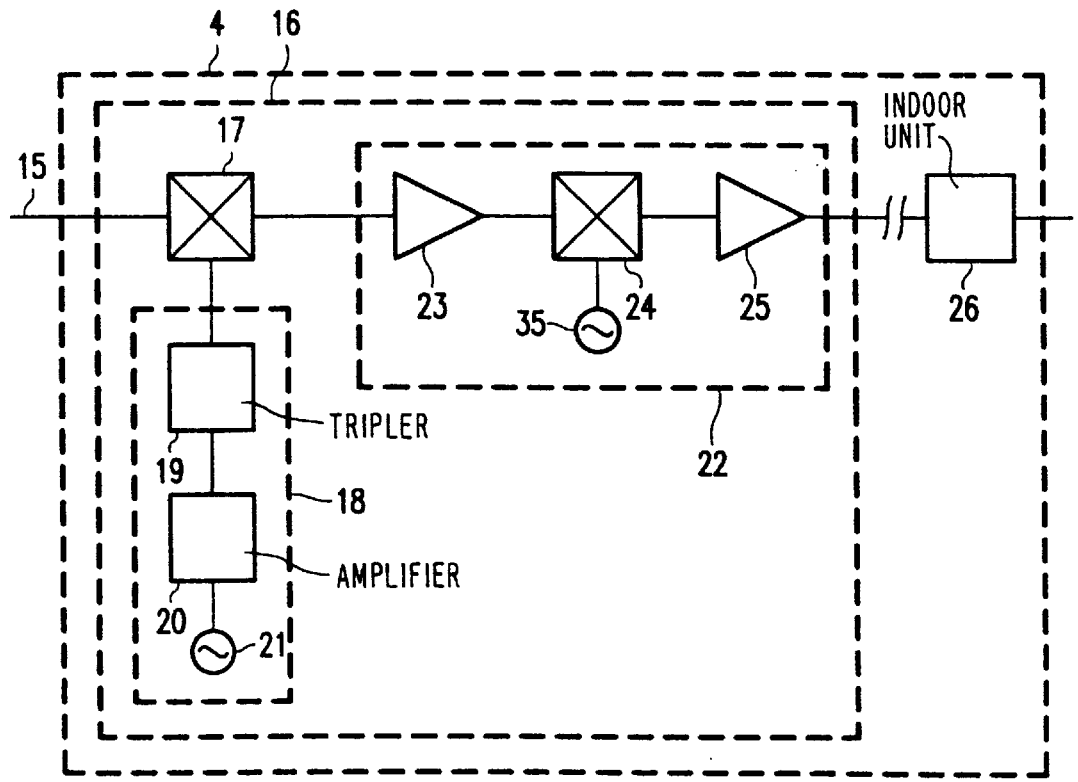
FIG. 2 in a block diagram of the receiver to be used in a transmission system according to the invention.

In the receiver 4 according to FIG. 2 the input signal is coupled via the transmission line being here a waveguide 15 to an input of an outdoor unit 16. the input of said outdoor unit 16 is formed by a first input of the mixer 17. An output of the local oscillator unit 18 is coupled to a second input of the mixer 17. The local oscillator unit 18 comprises a local oscillator 21 having an output coupled to an input of an amplifier 20. The output of the amplifier 20 is coupled to the input of a tripler 19. The output of the tripler 19 constitutes the output of the local oscillator unit 18.

The output of the mixer 17 is coupled to an input of the down converter 22. The input of the down converter 22 is coupled to an input of a low noise amplifier 23. The output of the low noise amplifier 23 is coupled to a first input of a mixer 24. The output of an oscillator 35 is coupled to a second input of the mixer 24. The output of the mixer 24 is coupled to the input of an amplifier 25. The output of the amplifier 25 constitutes the output of the outdoor unit 16. The outdoor unit 16 is coupled via a coaxial cable to the indoor unit 26, the output of which is connected to the TV set.

The antenna signal is fed via the waveguide 15 to the mixer 17. The dimensions of the waveguide 15 are chosen to obtain a cut off frequency which is well above the frequency of the signal generated by the local oscillator unit 18. The length of the waveguide 15 is chosen to obtain sufficient suppression of the local oscillator signal. The standard down converter 22 is commercially available from Philips Components under type Nos. SC 813 and SC 815. Assuming an input frequency for the down converter 22 of 11.5 GHz and a reception band from 40.5 to 42.5 GHz the frequency from the local oscillator unit 18 must be adjustable from 29 GHz to 31 GHz.

To generate the local oscillator signal the local oscillator 21 generates a signal in the 10 GHz range. This signal is amplified by means of the amplifier 20 to a sufficient level. The output signal of the amplifier 20 is multiplied in frequency by a factor of three by the tripler 19 so that a signal having the desired frequency is available at the second input of the mixer 17. The tripler 19 can be built using a varactor diode mounted in a waveguide. A suitable varactor diode is commercially available from Philips Components under type No. CXY 12/38/073.

The output signal from the mixer 17 is amplified by the low noise amplifier 23 of the down converter 22. The output signal of the low noise amplifier is converted to a frequency in the range from 0.95 GHz to 1.7 GHz by mixing a 10 GHz signal from the oscillator 35 with the output signal of the low noise amplifier 24 by means of the mixer 24. The output signal of the mixer 24 is amplified by the amplifier 25 and transmitted to the indoor unit 26. The indoor unit 26 converts the signal received from the outdoor unit 16 into a signal which is suitable for a customary TV set. The indoor unit is of the type used for the reception of direct broadcast satellites and is commercially available from Philips Consumer Electronics.

Figure 3:
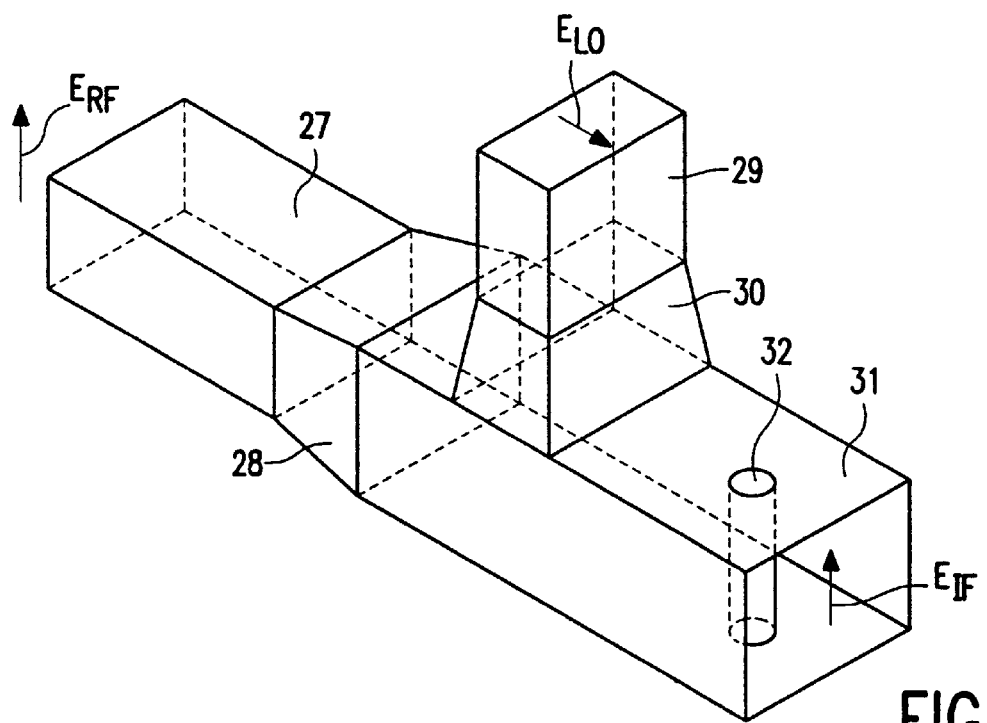
FIG. 3 is an isometric view of an embodiment of the mixer 17 according to FIG. 2.

In the mixer 17 according to FIG. 3 the received signal is applied to the waveguide section 27. The dimensions of said waveguide section are chosen to obtain a cut off frequency above the frequency of the local oscillator. The relation between cut off frequency and dimensions of the waveguide is well known to those skilled in the art, and is e.g. described in the book "Microwave engineering" by A. F. Harvey published by Academic Press Inc. 1963 section 1.4 pp. 11–14. The length of the waveguide section 27 to obtain a desired attenuation of the local oscillator signal can also be easily determined from the expressions presented in the above mentioned book.

The output of the waveguide section 27 is guided via a transition section 28 to a waveguide section 31 large enough to conduct the IF signals having a frequency of approximately 11.5 GHz. Furthermore the output signal of the local oscillator unit 18 is coupled into the waveguide section 31 via the waveguide section 29 and the transition section 30. In the waveguide section 31 the electric fields from the input signal and the local oscillator signal are added. Due to the non-linear transfer characteristics of the diode 32 an IF signal having the desired frequency is generated, and is available at the output of the waveguide section 31.

Figure 4:
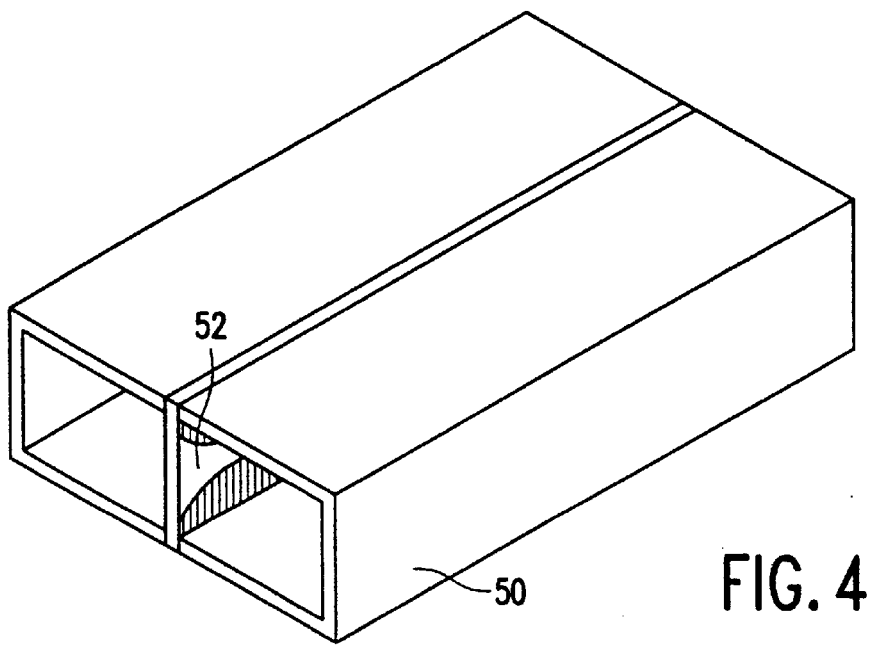
FIG. 4 is an isometric view of a second embodiment of the mixer 17 according to FIG. 2.

In the mixer 17 according to FIG. 4 a carrier 52 is introduced in the waveguide 50. This carrier is positioned in parallel with the E-plane of the field in the waveguide 50.

Figure 5:
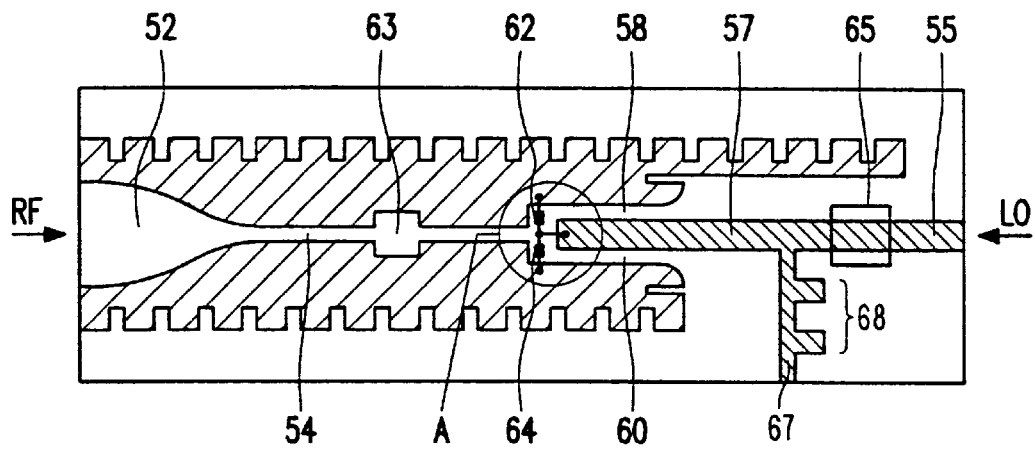
FIG. 5 is a cross section of the mixer according to FIG. 4.

In the cross section according to FIG. 5 of the mixer 17 according to FIG. 4 the RF signal enters the mixer in taper 52 which transforms the received signal into a signal which is carried by the fin line waveguide 54. The part 63 forms an impedance transformation section which adapts the impedance of the waveguide 50 to the impedance needed for the mixing diodes 62 and 64. At the mixing diodes 62 and 64 the received signal is split in two equal parts being in phase.

The local oscillator signal is applied via the stripline 55 to the mixer. This local oscillator is transferred via the high-pass filter 65 to the stripline 57. The signal carried by the stripline 57 is transformed into two signals which are opposite in phase, being carried by the fin line waveguides 58 and 59. The signal which is carried by the fin line waveguide 58 is applied to the mixer diode 62, and the signal carried by the fin line waveguide 60 is applied to the mixer diode 64.

The mixer diodes are connected in series, and are biased with a DC current of 1 mA. Suitable diodes are gallium arsenide Mott diodes of the CAY 18 or CAY 19 type. The IF signal is available at the stripline 67, and is tapped OFF via the low pass filter 68. The high pass filter 65 is formed by a Z formed spacing which is made in the stripline 55.

Figure 6:
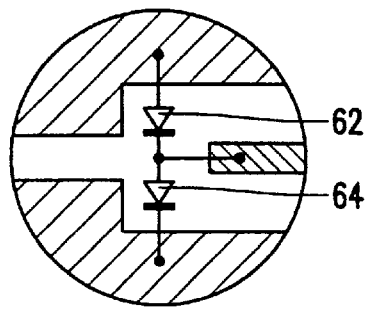
FIG. 6 is a cross sectional detail showing the connection of the mixer diodes 62 and 64 in FIG. 5.

In FIG. 6 it is shown that the mixer diodes 62 and 64 are connected in series between the conducting planes. The junction between the two mixer diodes 62 and 64 is connected to the stripline 57 for tapping off the IF signal.

Figure 7:
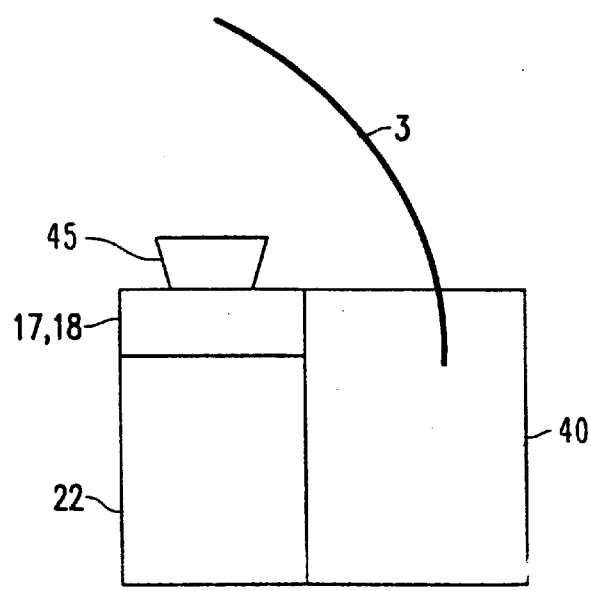
FIG. 7 shows an embodiment of the outdoor unit 16 according to FIG. 2.

In the receiver arrangement according to FIG. 7 a horn antenna 45 is attached to the input of the mixer 17 via the waveguide section 15 of FIG. 1. Above the horn antenna 45 a parabolic reflector 3 is mounted. The parabolic reflector 3 can be slid partially into the box 40, enabling the adaption of the effective area of said parabolic reflector 3. In this way the strength of the received signal level can be adjusted to avoid overload of the mixer 17 when a signal from a very near transmitter is received. In this way the application of passive attenuators can be avoided.

We claim:

1. A microwave receiver having an input, a mixer having first and second inputs, a transmission line coupling the receiver input to the first input, a local oscillator coupled to the second input, and a horn antenna coupled to said transmission line, characterized in that the transmission line has a high pass transfer function with a predetermined cut off frequency, the frequency of the local oscillator being lower than the predetermined cut off frequency, and the horn antenna comprises a reflector and means for controllably varying the effective area of the reflector, whereby strength of input signal to the mixer can be adjusted to avoid mixer overload.

2. A microwave receiver as claimed in claim 1, characterized in that the receiver further comprises means for moving the reflector to reduce the effective area.

3. A microwave transmission system comprising a microwave transmitter coupled to at least one microwave receiver via a transmission link, said receiver having an input, a mixer having first and second inputs, a transmission line coupling the receiver input to the first input, and a local oscillator coupled to the second input, characterized in that the transmission line comprises a hollow tubular waveguide whose cross-section dimensions are selected to produce a high pass transfer function with a predetermined cutoff frequency, the local oscillator signal has a frequency lower than the predetermined cutoff frequency, the receiver further comprises a horn antenna coupled directly to said waveguide, and the horn antenna comprises a reflector and means for controllably varying the effective area of the reflector, whereby strength of input signal to the mixer can be adjusted to avoid mixer overload.

4. A system as claimed in claim 3, characterized in that the receiver further comprises means for moving the reflector to reduce the effective area.

* * * * *